(12) United States Patent
Gurumurthy

(10) Patent No.: US 7,013,562 B2
(45) Date of Patent: Mar. 21, 2006

(54) METHOD OF USING MICRO-CONTACT IMPRINTED FEATURES FOR FORMATION OF ELECTRICAL INTERCONNECTS FOR SUBSTRATES

(75) Inventor: Charan Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 198 days.

(21) Appl. No.: 10/403,608

(22) Filed: Mar. 31, 2003

(65) Prior Publication Data

US 2004/0187310 A1    Sep. 30, 2004

(51) Int. Cl.
*H01K 3/10* (2006.01)

(52) U.S. Cl. .............................. 29/852; 29/825; 29/846; 438/443; 438/618; 438/637

(58) Field of Classification Search .................. 29/832, 29/825, 846, 852; 438/443, 618, 637
See application file for complete search history.

(56) References Cited

U.S. PATENT DOCUMENTS

| | | | |
|---|---|---|---|
| 6,599,824 B1 * | 7/2003 | Krivokapic | 438/618 |
| 6,623,803 B1 * | 9/2003 | Krivokapic | 427/304 |
| 6,849,558 B1 * | 2/2005 | Schaper | 438/758 |
| 6,866,764 B1 * | 3/2005 | Dalman et al. | 205/125 |
| 2004/0183236 A1 * | 9/2004 | Ogino et al. | 264/496 |

\* cited by examiner

*Primary Examiner*—Carl J. Arbes
(74) *Attorney, Agent, or Firm*—Blakely, Sokoloff, Taylor & Zafman LLP

(57) ABSTRACT

An imprinting stamp to imprint an opening in a material layer in which the imprint stamp has a coating of a seed material. The seed material is transferred onto the surface within the opening to operate as a seed for filling the opening. In one embodiment, low surface energy material is used as a passivation layer between the imprinting surface and the seed coating to reduce adhesion during micro-contact transfer of the seed into the opening. The imprinting stamp is used to form trenches and via openings for formation of electrical interconnects.

15 Claims, 3 Drawing Sheets

METHOD OF USING MICRO-CONTACT IMPRINTED FEATURES FOR FORMATION OF ELECTRICAL INTERCONNECTS FOR SUBSTRATES

FIELD OF THE INVENTION

The embodiments of the present invention relate to semiconductor processing and, more specifically, to a use of a seed layer coated imprinting stamp to form interconnect formations.

BACKGROUND OF THE RELATED ART

In the manufacture of semiconductor integrated circuit devices a variety of techniques are known for constructing different electrical interconnect features. For example, features, such as line traces, trenches, and via formations, form the conductive paths horizontally and vertically on a semiconductor substrate. As the density of devices increase significantly, new techniques are developed to increase interconnect density without substantial impact to cost, throughput and complexity in manufacturing. Accordingly new techniques which increase wiring or feature density, with the added benefit of reducing manufacturing complexity and/or costs, are an attractive advantage.

In the formation of various interconnect features, a typical practice is to use a photolithographic process for patterning and developing a photoresistive material (photoresist) to define the various interconnect features. For example, in one technique, a uniform layer of a conductor, such as copper, is formed on a dielectric layer and then coated with photoresist. Subsequently, masking and lithography are employed to pattern the photoresist. Then, the photoresist is developed so that the pattern is transferred to the copper material to identify underlying features and the remaining copper forms the conductive regions, such as line traces, on the surface of the dielectric. Openings are formed in the dielectric at various locations for the formation of vias. Vias extending completely through the dielectric layer allow for an electrical path from regions above the dielectric layer to those regions under the dielectric layer. The usage of various interconnecting features, as well as the use of pattern lithography to form such features, are generally known in the art.

In another example using the photoresist/lithography technique to form interconnects, a copper sheet is used to clad a dielectric core on both the upper and lower surfaces. Subsequently, the photoresist layer is deposited and masking and photolithography are used to pattern the photoresist. Next, the photoresist is developed to define the features and these features are exposed with the stripping of the photoresist. Subsequently, the assembly is laminated to cover the formed traces. Next, a laser micro via and mechanical drilling techniques are used to drill openings through the lamination to expose the trace or, alternatively, the drilling is performed completely through the lamination and to the core so that an opening extends completely through from the top surface. The procedure is then followed by a plating technique in which the exposed regions are plated. Generally, this technique will cover the exposed traces along the surface of the core but the vias extending through from the top to the bottom surface still remain, although the surfaces are plated. Next the vias are then plugged with a conductive material and the excess material is removed, by procedures such as grinding. Finally, a lid plating process is used to cover the upper and bottom surfaces of the plated hole. Further patterning may then be used to identify the conductive regions. Similar photoresist, masking, lithography procedures, as earlier described above, may be employed to pattern and define the traces along the upper and/or lower surfaces of the assembly.

DETAILED DESCRIPTION OF THE INVENTION

Figure 1:
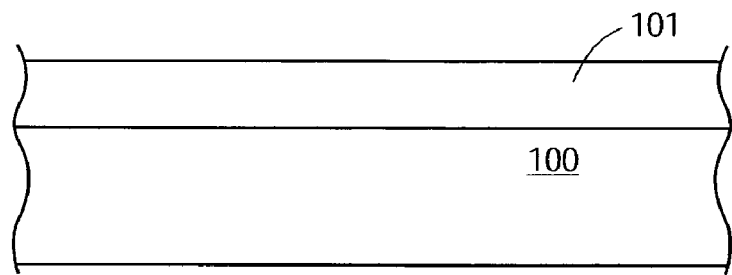
FIG. 1 shows a substrate having a conductive layer and an overlying dielectric layer.

FIGS. 1–6 show a sequence of operations to practice one embodiment of the invention. In FIG. 1, a dielectric material layer 101 is formed over an underlying material layer 100. The underlying material layer 100 may be comprised of a variety of materials, including a dielectric or conductive material. The underlying material may be a base substrate or a layer formed on a substrate. In the particular example embodiment shown, the underlying material is comprised of a conductive material generally used as a conductor in microelectronic applications. Thus, materials such as copper, gold or aluminum (or alloys of such metals) may comprise the underlying material. In one embodiment, underlying layer 100 may be a metal layer formed on a semiconductor substrate and the dielectric layer may operate as the insulating layer between underlying layer 100 and another metal layer formed over the dielectric layer 101. It is to be noted that a variety of processes, including known deposition processes, may be utilized to form dielectric layer 101 over the layer 100. Dielectric layer 101 may comprise a variety of materials, including, but not limited to, oxides, nitrides, organics, ceramics, etc.

Figure 2:
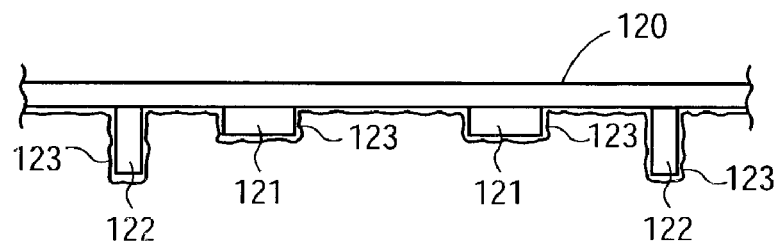
FIG. 2 shows an embodiment of an imprinting stamp (which may have a low surface energy material thereon), in which a seed material is coated onto the stamp surfaces of the imprinting stamp.

FIG. 2 shows an imprinting stamp 120 used to imprint a pattern onto or into a surface of a material. An imprinting procedure to form trench and via features is an emerging technology in which micro-contact printing stamp is used to stamp out features. Micro-contact printing has the advantage in that openings may be formed without the traditional photolithographic process to pattern, develop and strip away the photoresist. Thus, in FIG. 2, an example imprinting stamp 120 is shown having stamp surfaces 121 and 122. A variety of patterns may be formed, but in this instance, stamp surfaces 121 are used to form trenches and stamp surfaces 122 are used to form via openings.

Although the imprinting stamp 120 may be used without further processing to stamp out openings and passages, the imprinting stamp 120 undergoes at least one additional processing. As noted, a seed layer 123 is formed along the lower stamp surface, including along surfaces 121, 122. The seed material selected for the seed layer 123 depends on the material to be grown in the formed stamped openings. Thus, for copper formation, a seed layer for copper growth is selected. Generally for copper growth, copper would be selected for the material of seed layer 123. As noted in FIG. 2, copper is coated onto the lower stamp surfaces to form the seed layer 123.

A variety of processes, including known processes may be used to coat the seed layer 123. For example, sputtering, vapor deposition, electroless deposition or other thin film deposition techniques may be used to coat the seed layer 123 onto the lower stamp surfaces. These are example processes only and are not described to limit the embodiments available. Although thickness of the seed layer 123 may vary significantly, generally, a thickness of approximately 20–30 nanometers (nm) is adequate to transfer the seed material into the stamped out openings as described below.

In one embodiment of the invention, the seed layer is coated onto the lower stamp surfaces as described above and transferred onto the stamped out opening. In another embodiment of the invention, the lower surfaces are first passivated by a monolayer or greater of low surface energy material to reduce the adhesion between the stamp surfaces and the seed material of layer 123. A variety of passivating materials may be used. For example, material such as poly tetra fluro ethyelen (PTFE, which is similar to the material used in non-stick cooking utensils) may be used. Dip coated/ spun cast octadecyl trichloro silane (OTS) is another material available for use as the passivating material between the lower stamp surfaces and the seed layer 123. Other coatings may be used. Then, the seed layer 123 is coated onto the passivating material, as described previously. Again, the seed layer 123 may vary in thickness, but generally, a thickness of approximately 20–30 nm is adequate for seed material transfer.

Figure 3:
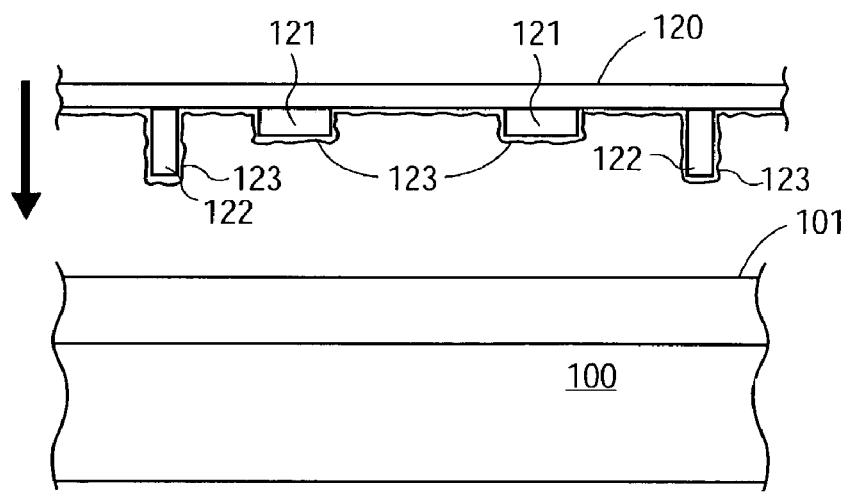
FIG. 3 shows an use of the stamp of FIG. 2 to imprint trenches and via openings onto structure of FIG. 1.

Then, as shown in FIG. 3, the imprinting stamp 120 is utilized to imprint (mechanically punch) a pattern. In the example shown in FIG. 3, the structure of FIG. 1 is imprinted with the stamp 120 of FIG. 2. Stamp surfaces 121 form trench imprints and stamp surfaces 122 form via imprints into the structure of FIG. 1. The resulting imprinted pattern is shown in FIG. 4.

Figure 4:
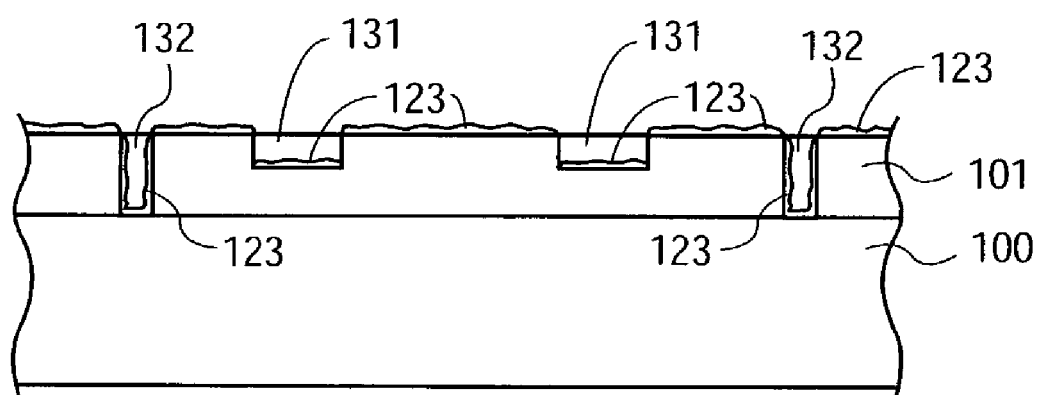
FIG. 4 shows the resultant imprinted structure of FIG. 3 after the seed layer is transferred to the floor and sidewalls of the trench and via openings by micro-contact.

In FIG. 4, the resulting imprints of stamp surfaces 121, 122 are shown as trenches 131 and via openings 132, respectively. The trenches 131 reside within the dielectric layer 123, but the via openings 132 extend down to the underlying layer 100. The extent of the depth of imprint of the via opening 132 will depend on the particular application and such depth may be shallow (reaching layer 100 only) or may extend into the bottom layer 100 or, in some instances, even completely through layer 100.

During imprinting of the trenches 131 and via openings 132, the thin seed layer 123 is micro-contact printed onto surfaces that it comes into contact, including the floor and sidewalls of the trenches 131 and via openings 132. The above-described embodiment utilizing the passivation surface to reduce adhesion may be more successful in transferring the seed material, since adhesion is reduced when the passivation layer. FIG. 4 shows the structure after the transfer of the seed material and removal of the stamp 120. In this instance, the trench 131 are partly into the dielectric layer 101 and the via openings 132 extend through the layer 101 to the underlying layer 100.

Figure 5:
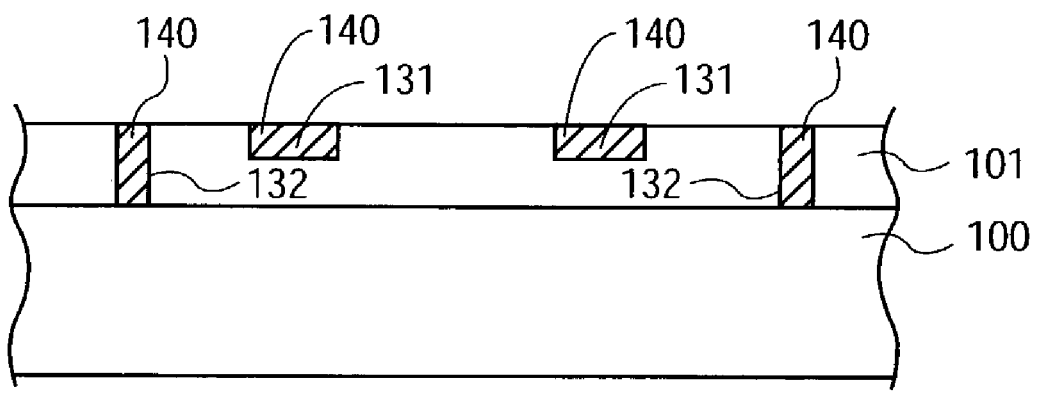
FIG. 5 shows the resultant structure after deposition or growth of interconnect metal in the imprinted openings of the structure of FIG. 4.

Once the seed material micro-contacts the floor and sidewalls of the imprinted regions, then the metal (or metal alloy) may be deposited or grown by a variety of techniques. In the above example, where copper seed layer is used, copper is then deposited or grown in the trenches 131 and via openings 132 to form the interconnects 140. In one embodiment, copper is grown by electrolytic plating, electroless plating or conductive adhesive. The trench interconnects may form wiring or lines of a microelectronic device, while the via interconnect form inter-level connections. The presence of the seed layer ensures that the interconnect material has adequate seed surface to initiate deposition/ growth. FIG. 5 shows the structure with the electrical interconnects 140 formed and after practice of some procedure (such as grinding) to remove the seed layer from those regions of the surface where seeding is not needed.

Figure 6:
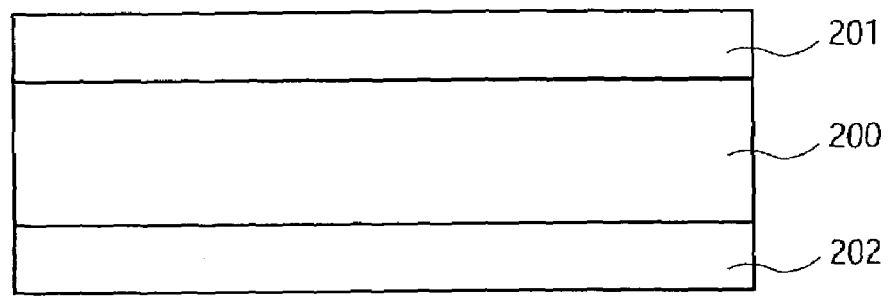
FIG. 6 shows another embodiment of the invention in which a metal core has overlying and underlying dielectric layers.
Figure 7:
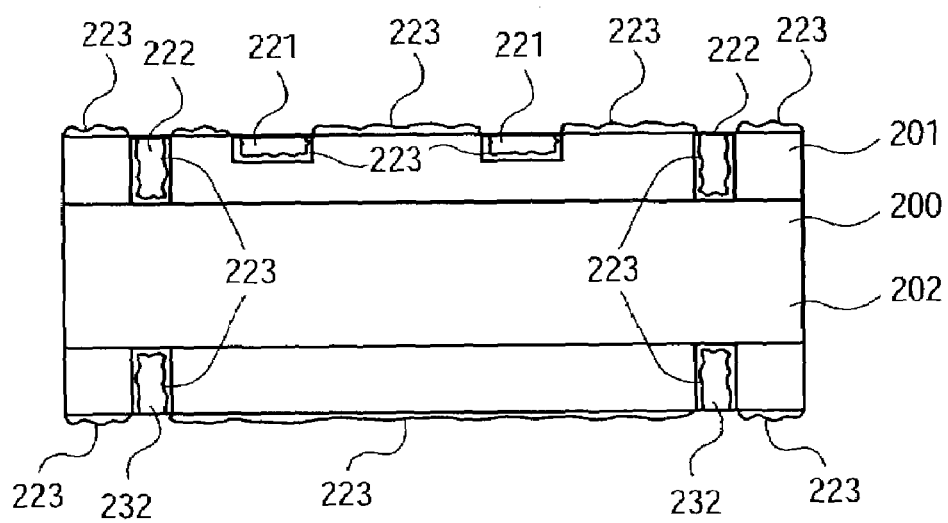
FIG. 7 shows formation of trench and via openings by imprinting the structure of FIG. 6.
Figure 8:
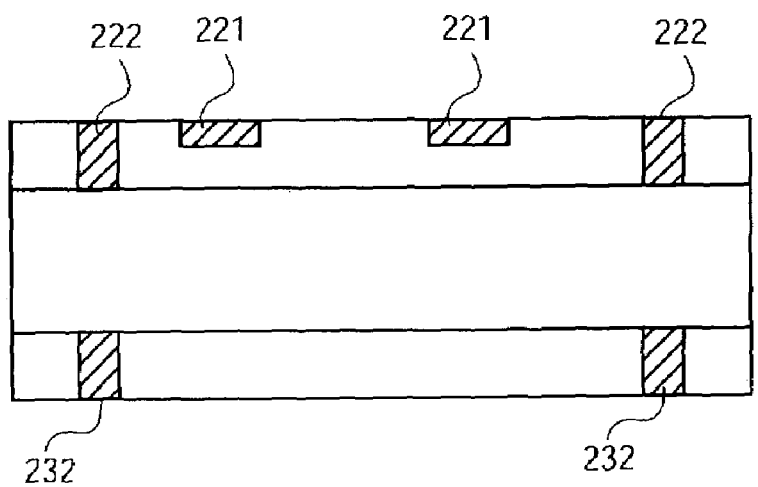
FIG. 8 shows formation of interconnects after metal deposition or growth to the structure of FIG. 7.

FIGS. 6–8 show another embodiment of the invention in which a bare or patterned core 200 has dielectric material deposited on both the top and bottom surfaces to form dielectric layer 201 and 202, respectively. As an example, core 200 may be comprised of copper (aluminum, gold, or other metals and alloys) and the dielectric layers 201, 202 may be comprised of various oxides, nitrides, organics, ceramics, etc. The starting structure is shown in FIG. 6.

Subsequently, an imprinting stamp, such as the previously described imprinting stamp 120 shown of FIG. 2 is used to imprint the trenches 221 and via openings 222. The imprinting transfers a seed material 223 on to surfaces that it contacts, including the floor and sidewalls of the imprinted regions of trenches 221 and via openings 222. As noted above, passivation layer may be used to reduce the adhesion of the seed material on the stamp surface, so that a more effective micro-contact transfer is made of the seed material. In this example, the via openings are shown extending through the dielectric layer 201 to reach the core 200. A similar imprinting technique is used to imprint a pattern into the dielectric layer 202. In this instance, via openings 232 through the dielectric layer 202 are shown to reach the core 200. The resulting structure is shown in FIG. 7. Then, the interconnect material is deposited or grown in the imprinted openings to form the electrical interconnects, which structure is shown in FIG. 8.

A number of advantages may be derived from the practice of the embodiments of the invention. Instead of using the photolithographic procedure which may require five major phases (laminating or depositing metal, depositing of photoresist, generating a pattern, developing the photoresist and stripping the photoresist), the imprinting procedure uses two phases (imprinting and metal deposition or growth). The seed material on the imprinting stamp transfers to the imprinted openings and facilitates the deposition or growth of the interconnect material in the imprinted openings. The seed layer need not be separately deposited, since this is achieved by the micro-contact. The various embodiments of the invention may be more attractive to some processes, but may be adapted to various other processes as well. The reduction in the number of processing phases may also reduce the cost of manufacturing for some microelectronic devices.

Thus, method of using micro-contact imprinted features for formation of electrical interconnects for substrates is described. The techniques allow for formation of various electrical interconnects, including high-density interconnect (HDI) and low-density interconnect (LDI).

I claim:

1. A method comprising:
   coating stamp surfaces of an imprinting stamp with a seed layer;
   imprinting a surface of a material layer to form a first via and a first trench and
   transferring the seed layer to a surface within the first via and the first trench by micro-contact imprinting; and
   filling the first via and the first trench with filler material which formation is started by the seed layer.

2. The method of claim 1, wherein the coating the stamp surfaces coats a seed layer of approximately 20–30 nanometers.

3. The method of claim 1, wherein the coating the stamp surfaces coats a metal seed layer.

4. The method of claim 1, wherein the material layer being imprinted is a dielectric layer and the stamp coats a metal seed layer in the first via and the first trench formed in the dielectric layer.

5. The method of claim 4, wherein the imprinting forms multiple vias and trenches.

6. The method of claim 5, wherein the filling includes filling the multiple vias and trenches with a conductive material, which is started by the seed layer.

7. The method of claim 1, wherein the coating coats a seed layer of copper and the filling fills the vias and trenches with copper.

8. A method comprising:
   coating stamp surfaces of an imprinting stamp with a passivation layer to reduce adhesion;
   coating a seed layer over the passivation layer;
   imprinting a surface of a dielectric layer to form interconnect openings and transferring the seed layer to surfaces within the interconnect openings by microcontact imprinting; and
   filling the opening with conductive material which formation is started by the seed layer.

9. The method of claim 8, wherein the coating the seed layer coats a seed layer of approximately 20–30 nanometers.

10. The method of claim 9, wherein the coating the seed layer coats a metal seed layer.

11. The method of claim 9, wherein the coating the seed layer coats a seed layer of copper.

12. The method of claim 11, wherein the filling the opening with the conductive material is achieved by electrolytic or electroless plating of copper.

13. The method of claim 8, wherein the coating the passivation layer coats at least a monolayer of low surface energy material as the passivation layer.

14. The method of claim 13, wherein the coating the passivation layer coats at least a monolayer of poly tetra fluro ethyelen as the passivation layer.

15. The method of claim 13, wherein the coating the passivation layer coats at least a monolayer of octadecyl trichloro silane as the passivation layer.

* * * * *